United States Patent
Jou et al.

(10) Patent No.: US 8,837,207 B1
(45) Date of Patent: Sep. 16, 2014

(54) STATIC MEMORY AND MEMORY CELL THEREOF

(71) Applicant: National Chiao Tung University, Hsinchu (TW)

(72) Inventors: Shyh-Jye Jou, Hsinchu (TW); Ming-Hsien Tu, Hsinchu (TW); Yu-Hao Hu, Hsinchu (TW); Ching-Te Chuang, Hsinchu (TW); Yi-Wei Chiu, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 14/049,212

(22) Filed: Oct. 9, 2013

(30) Foreign Application Priority Data

Apr. 23, 2013 (TW) .............................. 102114386 A

(51) Int. Cl.
*G11C 11/00* (2006.01)
*G11C 11/412* (2006.01)

(52) U.S. Cl.
CPC ................................... *G11C 11/412* (2013.01)
USPC ........................ 365/154; 365/189.11; 365/156

(58) Field of Classification Search
CPC .. G11C 11/413; G11C 11/417; G11C 11/412; G11C 11/419; G11C 16/0483; G11C 5/145; G11C 8/08
USPC .......................... 365/154, 189.11, 156, 189.09
See application file for complete search history.

(56) References Cited

U.S. PATENT DOCUMENTS

| | | | |
|---|---|---|---|
| 5,764,564 A | 6/1998 | Frake et al. | |
| 7,324,368 B2 | 1/2008 | Wang et al. | |
| 7,420,835 B2 * | 9/2008 | Wang et al. | 365/154 |
| 7,852,661 B2 | 12/2010 | Liu | |
| 7,898,875 B2 | 3/2011 | Tao et al. | |
| 2011/0317476 A1 | 12/2011 | Deng | |
| 2012/0008377 A1 | 1/2012 | Chuang et al. | |
| 2012/0008449 A1 | 1/2012 | Chuang et al. | |
| 2012/0014172 A1 | 1/2012 | Jung et al. | |
| 2012/0044779 A1 | 2/2012 | Chuang et al. | |
| 2012/0140552 A1 | 6/2012 | Seikh et al. | |

OTHER PUBLICATIONS

Chang et al., "A 32 kb 10T Sub-Threshold SRAM Array With Bit-Interleaving and Differential Read Scheme in 90 nm CMOS," IEEE Journal of Solid-State Circuits, vol. 44, No. 2, Feb. 2009, pp. 650-658.

Chang et al., "A 130mV SRAM With Expanded Write and Read Margins for Subthreshold Applications," IEEE Journal of Solid-State Circuits, vol. 46, No. 2, Feb. 2011, pp. 520-529.

* cited by examiner

*Primary Examiner* — David Lam
(74) *Attorney, Agent, or Firm* — Jianq Chyun IP Office

(57) ABSTRACT

A static memory and a static memory cell are provided. The static memory cell includes a first transistor, a second transistor, a third transistor, a fourth transistor, a fifth transistor, a sixth transistor, a first switch, a second switch, a third switch, a first pull-down switch, and a second pull-down switch. When a data writing operation is performed, the latching capability of the latch circuit constituted by the first to the sixth transistors is disabled by turning off the second transistor or the fifth transistor, so that the speed of the data writing operation is increased and the data writing performance is improved. The first switch and the second switch provide a path for reading or writing data, and the third switch is coupled to a bit line for receiving data from or transmitting data to the bit line.

16 Claims, 5 Drawing Sheets

STATIC MEMORY AND MEMORY CELL THEREOF

CROSS-REFERENCE TO RELATED APPLICATION

This application claims the priority benefit of Taiwan application serial no. 102114386, filed on Apr. 23, 2013. The entirety of the above-mentioned patent application is hereby incorporated by reference herein and made a part of this specification.

BACKGROUND OF THE INVENTION

1. Field of the Invention

The present invention generally relates to a static memory cell and a static memory, and more particularly, to a static memory cell which can work with a sub-threshold voltage and a static memory.

2. Description of Related Art

FIG. 1 is a circuit diagram of a conventional static memory cell 100. Please refer to FIG. 1, the static memory cell 100 includes transistors M1-M6 and transistors MP1 and MP2. When a data writing operation is performed on the static memory cell 100, the transistors MP1 and MP2 are turned off through a transverse word line signal WL and a column selection signal CS, and the transistors M1-M4 are cut off from a reference operating power supply VDD. Meanwhile, the transistors M5 and M6 are turned on through the word line signal WL, so that data on the bit line BL and the reverse bit line BLB can be transmitted to the transistors M1-M4. When the transistors MP1 and MP2 are turned off, data on the bit line BL and the reverse bit line BLB can be easily and quickly written into the latch circuit constituted by the transistors M1-M4. Thereby, the data writing performance is effectively improved.

When a data writing operation is performed on the conventional static memory cell 100, only data of logic 0 can be written through the N-type transistors M3 and M4 according to the voltage on the ground terminal GND. However, when data of logic 1 is to be written, there is no P-type transistor for performing such an operation. As a result, the writing process may be affected by noises and become unreliable. In addition, when a data writing operation is performed on the static memory cell 100, the voltage on the storage point ST for storing data is also affected by the voltage division effect of the transistors M5 and M3, and when the transistor M3 offers a high driving capability, the voltage on the storage point ST is low therefore is easily affected by noises. This phenomenon becomes more obvious when the voltage level of the reference operating power supply VDD is lower. Thus, the static memory cell 100 cannot work with a low reference operating power supply VDD.

SUMMARY OF THE INVENTION

Accordingly, the present invention is directed to several static memories and static memory cells that can work with low voltages and a sub-threshold voltage.

The present invention provides a static memory cell including a first transistor, a second transistor, a third transistor, a fourth transistor, a fifth transistor, a sixth transistor, a first switch, a second switch, a third switch, a first pull-down switch, and a second pull-down switch. The first terminal of the first transistor is coupled to a reference operating power supply. The first terminal of the second transistor is coupled to the second terminal of the first transistor, the second terminal of the second transistor is coupled to a first output terminal, and the control terminal of the second transistor receives a first write word line signal. The first terminal of the third transistor is coupled to the first output terminal, the control terminal of the third transistor is coupled to the control terminal of the first transistor and a second output terminal, and the second terminal of the third transistor is coupled to a ground terminal. The first terminal of the fourth transistor is coupled to the reference operating power supply. The first terminal of the fifth transistor is coupled to the second terminal of the fourth transistor, the second terminal of the fifth transistor is coupled to the second output terminal, and the control terminal of the fifth transistor receives a second write word line signal. The first terminal of the sixth transistor is coupled to the second output terminal, the control terminal of the sixth transistor is coupled to the control terminal of the fourth transistor and the first output terminal, and the second terminal of the sixth transistor is coupled to the ground terminal. The first switch is coupled to the first output terminal and is turned on or off according to a read word line signal. The second switch is coupled to the second output terminal and is turned on or off according to the second write word line signal. The first terminal of the third switch is coupled to the second terminal of the second switch, the second terminal of the third switch is coupled to a first bit line, and the third switch is turned on or off according to the read word line signal. The first pull-down switch is serially connected between the second terminal of the first switch and a reference ground voltage and is turned on or off according to the voltage of the first write word line signal. The second pull-down switch is serially connected between the second terminal of the second switch and the reference ground voltage and is turned on or off according to the voltage on the second output terminal.

The present invention provides a static memory cell including a first transistor, a second transistor, a third transistor, a fourth transistor, a fifth transistor, a sixth transistor, a first switch, a second switch, a third switch, a fourth switch, a first pull-down switch, and a second pull-down switch. The first transistor has a first terminal, a second terminal, and a control terminal. The first terminal of the first transistor is coupled to a reference operating power supply. The second transistor has a first terminal, a second terminal, and a control terminal. The first terminal of the second transistor is coupled to the second terminal of the first transistor, the second terminal of the second transistor is coupled to a first output terminal, and the control terminal of the second transistor receives a first write word line signal. The third transistor has a first terminal, a second terminal, and a control terminal. The first terminal of the third transistor is coupled to the first output terminal, the control terminal of the third transistor is coupled to the control terminal of the first transistor and a second output terminal, and the second terminal of the third transistor is coupled to a ground terminal. The fourth transistor has a first terminal, a second terminal, and a control terminal. The first terminal of the fourth transistor is coupled to the reference operating power supply. The fifth transistor has a first terminal, a second terminal, and a control terminal. The first terminal of the fifth transistor is coupled to the second terminal of the fourth transistor, the second terminal of the fifth transistor is coupled to the second output terminal, and the control terminal of the fifth transistor receives a second write word line signal. The sixth transistor has a first terminal, a second terminal, and a control terminal. The first terminal of the sixth transistor is coupled to the second output terminal, the control terminal of the sixth transistor is coupled to the control terminal of the fourth transistor and the first output terminal, and the second terminal of the sixth transistor is coupled to the ground terminal. The first terminal of the first switch is coupled to the first output terminal, and the first switch is turned on or off according to the first write word line signal. The first terminal of the second switch is coupled to the second output terminal, and the second switch is turned on or off according to the second write word line signal. The first terminal of the third switch is coupled to the second terminal of the second switch, the second terminal of the third switch is coupled to a first bit line, and the third switch is turned on or off according to a read word line signal. The first pull-down switch is serially connected between the second terminal of the first switch and a reference ground voltage, and the first pull-down switch is turned on or off according to the voltage on the first output terminal. The second pull-down switch is serially connected between the second terminal of the second switch and the reference ground voltage, and the second pull-down switch is turned on or off according to the voltage on the second output terminal. The first terminal of the fourth switch is coupled to the second terminal of the first switch, the second terminal of the fourth switch is coupled to a second bit line, and the fourth switch is turned on or off according to the read word line signal.

The present invention provides a static memory cell including a first transistor, a second transistor, a third transistor, a fourth transistor, a fifth transistor, a sixth transistor, a seventh transistor, an eighth transistor, a first switch, a second switch, a third switch, and a fourth switch. The first transistor is coupled to a reference operating power supply. The first terminal of the second transistor is coupled to the second terminal of the first transistor, the second terminal of the second transistor is coupled to a first output terminal, and the control terminal of the second transistor receives a write word line signal. The first terminal and the second terminal of the third transistor are respectively coupled to the first terminal and the second terminal of the second transistor, and the control terminal of the third transistor receives a data signal. The first terminal of the fourth transistor is coupled to the first output terminal, the control terminal of the fourth transistor is coupled to the control terminal of the first transistor and a second output terminal, and the second terminal of the fourth transistor is coupled to a ground terminal. The first terminal of the fifth transistor is coupled to the reference operating power supply. The first terminal of the sixth transistor is coupled to the second terminal of the fifth transistor, the second terminal of the sixth transistor is coupled to the second output terminal, and the control terminal of the sixth transistor receives the write word line signal. The first terminal and the second terminal of the seventh transistor are respectively coupled to the first terminal and the second terminal of the sixth transistor, and the control terminal of the seventh transistor receives a reverse data signal. The first terminal of the eighth transistor is coupled to the second output terminal, the control terminal of the eighth transistor is coupled to the control terminal of the fifth transistor and the first output terminal, and the second terminal of the eighth transistor is coupled to the ground terminal. The first terminal of the first switch is coupled to a reverse bit line, the second terminal of the first switch is coupled to the first output terminal, and the first switch is turned on or off according to the write word line signal. The first terminal of the second switch is coupled to a bit line, the second terminal of the second switch is coupled to the second output terminal, and the second switch is turned on or off according to the write word line signal. The fourth switch is turned on or off according to the voltage on the second output terminal. The second terminal of the third switch is coupled to a read bit line, and the third switch is turned on or off according to a read word line signal.

The present invention provides a static memory including a plurality of read word lines, a plurality of bit line pairs, and a plurality of static memory cells described above. The read word lines respectively transmit a plurality of read word line signals. The bit line pairs respectively include a plurality of bit lines and a plurality of reverse bit lines. The static memory cells are arranged into an array to form a plurality of memory cell columns and a plurality of memory cell rows. The static memory cells in the memory cell columns are respectively coupled to the bit line pairs, and the static memory cells in the memory cell rows are respectively coupled to the read word lines.

The present invention provides a static memory including a plurality of read word lines, a plurality of bit line pairs, and a plurality of static memory cells. The read word lines respectively transmit a plurality of read word line signals. The bit line pairs respectively include a plurality of bit lines and a plurality of reverse bit lines. The static memory cells are arranged into an array to form a plurality of memory cell columns and a plurality of memory cell rows. The static memory cells in the memory cell columns are respectively coupled to the bit line pairs, and the static memory cell in the memory cell rows are respectively coupled to the read word lines.

The present invention provides a static memory including a plurality of read word lines, a plurality of write word lines, a plurality of bit line pairs, a plurality of read bit lines, and a plurality of static memory cells. The read word lines respectively transmit a plurality of read word line signals. The write word lines respectively transmit a plurality of write word line signals. The bit line pairs respectively include a plurality of bit lines and a plurality of reverse bit lines. The static memory cells are arranged into an array to form a plurality of memory cell columns and a plurality of memory cell rows. The static memory cells in the memory cell columns are respectively coupled to the bit line pairs, and the static memory cells in the memory cell rows are respectively coupled to the read word lines.

As described above, in a static memory cell provided by the present invention, the time required for writing data is effectively shortened, so that the writing efficiency of a static memory is improved. Additionally, through the structure of a static memory cell provided by the present invention, the channel widths of the transistors in the static memory cell are effectively reduced, so that the surface area of a static memory is reduced. Moreover, in a static memory cell provided by the present invention, the power consumption is effectively reduced, so that the power consumed by the system chip in an application of an embedded memory can be greatly reduced.

These and other exemplary embodiments, features, aspects, and advantages of the invention will be described and become more apparent from the detailed description of exemplary embodiments when read in conjunction with accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
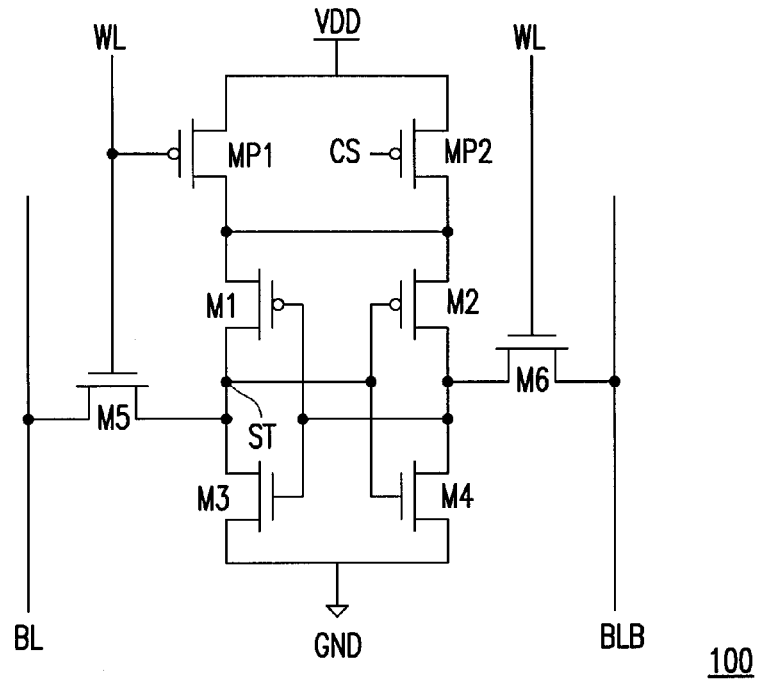
FIG. 1 is a circuit diagram of a conventional static memory cell 100.

Reference will now be made in detail to the present preferred embodiments of the invention, examples of which are illustrated in the accompanying drawings. Wherever possible, the same reference numbers are used in the drawings and the description to refer to the same or like parts.

Figure 2:
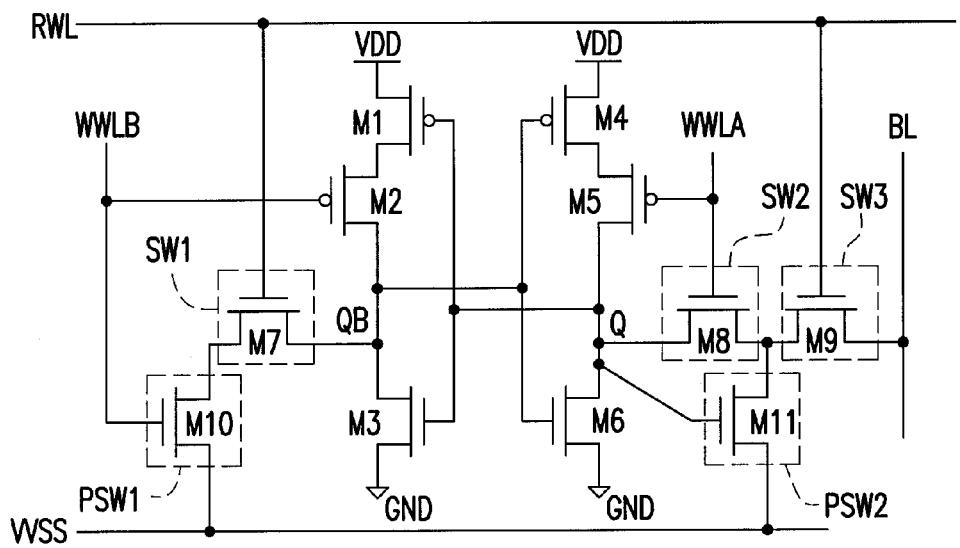
FIG. 2 is a diagram of a static memory cell 200 according to an embodiment of the present invention.

FIG. 2 is a diagram of a static memory cell 200 according to an embodiment of the present invention. Please refer to FIG. 2, the static memory cell 200 includes transistors M1-M6, switches SW1-SW3, and pull-down switches PSW1-PSW2. The first terminal of the transistor M1 is coupled to a reference operating power supply VDD. The first terminal of the transistor M2 is coupled to the second terminal of the transistor M1, the second terminal of the transistor M2 is coupled to an output terminal QB, and the control terminal of the transistor M2 receives a write word line signal WWLB. The first terminal of the transistor M3 is coupled to the output terminal QB, the control terminal of the transistor M3 is coupled to the control terminal of the transistor M1 and an output terminal Q, and the second terminal of the transistor M3 is coupled to a ground terminal GND. The first terminal of the transistor M4 is coupled to the reference operating power supply VDD. The first terminal of the transistor M5 is coupled to the second terminal of the transistor M4, the second terminal of the transistor M5 is coupled to the output terminal Q, and the control terminal of the transistor M5 receives a write word line signal WWLA. The first terminal of the transistor M6 is coupled to the output terminal Q, the control terminal of the transistor M6 is coupled to the control terminal of the transistor M4 and the output terminal QB, and the second terminal of the transistor M6 is coupled to the ground terminal GND.

The transistors M1, M2, M4, and M5 are P-type transistors, and the transistors M3 and M6 are N-type transistors. The control terminals of the transistors M1-M6 may be the gates thereof, the first terminals of the transistors M1, M2, M4, and M5 may be the sources thereof, and the second terminals of the transistors M1, M2, M4, and M5 may be the drains thereof. The first terminals of the transistors M3 and M6 may be the drains thereof, and the second terminals of the transistors M3 and M6 may be the sources thereof.

The first terminal of the switch SW1 is coupled to the output terminal QB, and the second terminal of the switch SW1 is coupled to the pull-down switch PSW1. The switch SW1 is turned on or off according to a read word line signal RWL. The first terminal of the switch SW2 is coupled to the output terminal Q. The switch SW2 is turned on or off according to the write word line signal WWLA. The first terminal of the switch SW3 is coupled to the second terminal of the switch SW2, and the second terminal of the switch SW3 is coupled to a bit line BL. The switch SW3 is turned on or off according to the read word line signal RWL.

The pull-down switch PSW1 is serially connected between the second terminal of the switch SW1 and a reference ground voltage VVSS. The pull-down switch PSW1 is turned on or off according to the first write word line signal WWLB. The pull-down switch PSW2 is serially connected between the second terminal of the switch SW2 and the reference ground voltage VVSS. The pull-down switch PSW2 is turned on or off according to the voltage on the output terminal Q.

It should be mentioned that when a data writing operation is performed, the write word line signals WWLA and WWLB are complementary signals. In addition, the switches SW1-SW3 and the pull-down switches PSW1 and PSW2 are switches respectively constructed through the transistors M7-M9, M10, and M11.

Regarding the overall operation, first, the reference ground voltage received by the selected static memory cell is set to be equal to the voltage (for example, 0V) on the ground terminal GND. When a data of logic 0 is written into the static memory cell 200, the data of logic 0 is transmitted on the bit line BL. The read word line signal RWL and the write word line signal WWLA are both logic 1, and the write word line signal WWLB is logic 0. Herein the switches SW1, SW3, and SW2 are turned on, the pull-down switch PSW1 is turned off, the transistor M5 is turned off, and the transistor M2 is turned on. The logic 0 on the bit line BL is transmitted to the output terminal Q through the turned-on switches SW2 and SW3. Since the transistor M5 is turned off, the data of logic 0 can be easily written to the output terminal Q. The logic 0 on the output terminal Q is transmitted to the control terminals of the transistors M1 and M3, so that the voltage level of the output terminal QB is pulled up to logic 1 through the turned-on transistors M1 and M2.

Contrarily, when a data of logic 1 is to be written into the static memory cell 200, a data of logic 0 is transmitted to the bit line BL. The read word line signal RWL and the write word line signal WWLB are both logic 1, and the write word line signal WWLA is logic 0. Herein the switches SW1 and SW3 are turned on, the switch SW2 is turned off, the pull-down switch PSW1 is turned on, the transistor M2 is turned off, and the transistor M5 is turned on. The logic 0 on the reference ground voltage VVSS is transmitted to the output terminal QB through the turned-on switch SW1 and pull-down switch PSW1. Since the transistor M2 is turned off, the data of logic 0 can be easily written into the output terminal QB. The logic 0 on the output terminal QB is transmitted to the control terminals of the transistors M4 and M6, so that the voltage level of the output terminal Q is pulled up to logic 1 through the turned-on transistors M4 and M5.

Before performing a data reading operation on the static memory cell 200, the bit line BL needs to be pre-charged to logic 1. When a data reading operation is performed on the static memory cell 200, both the write word line signals WWLA and WWLB are made to be equal to logic 0, and the read word line signal RWL is made to be equal to logic 1. Herein the switches SW1 and SW3 are turned on, and the pull-down switch PSW1 and the switch SW2 are turned off. If the voltage on the output terminal Q is equal to logic 1, the data of logic 0 provided by the reference ground voltage VVSS can be read through the turned-on pull-down switch PSW2 on the bit line BL. Contrarily, if the voltage on the output terminal Q is equal to logic 0, the pull-down switch PSW2 is turned off, and the voltage on the bit line BL is not affected and remains at logic 1.

It should be mentioned that when a static memory cell is not selected for performing a data reading/writing operation, the value of the reference ground voltage VVSS is set to be equal to the voltage value of the reference operating power supply VDD.

Figure 3:
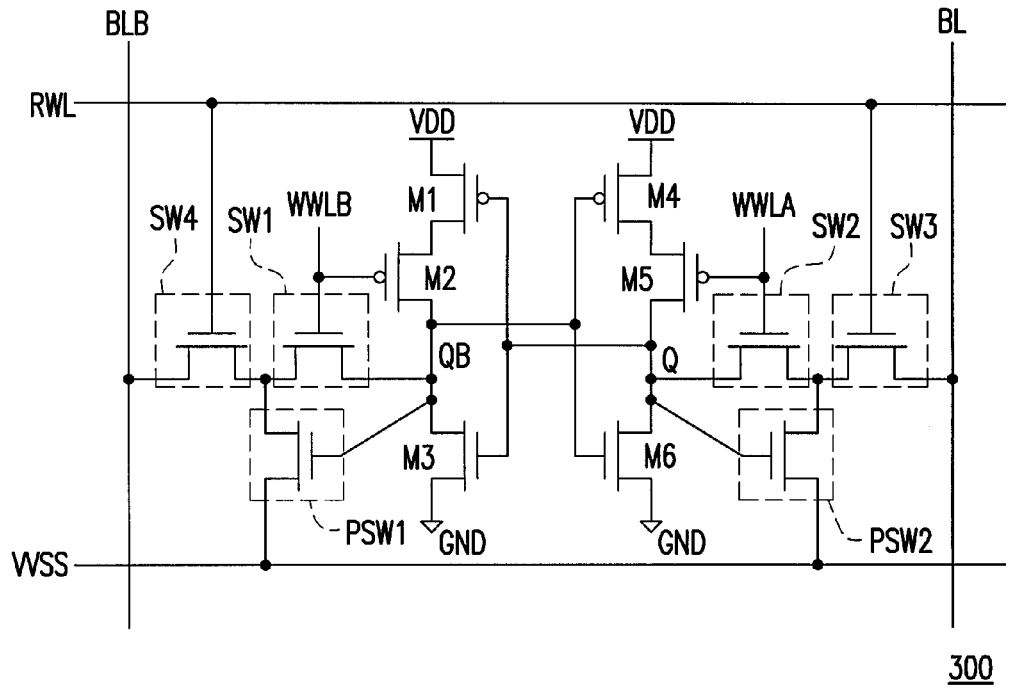
FIG. 3 is a diagram of a static memory cell 300 according to another embodiment of the present invention.

FIG. 3 is a diagram of a static memory cell 300 according to another embodiment of the present invention. Please refer to FIG. 3, the static memory cell 300 includes transistors M1-M6, switches SW1-SW4, and pull-down switches PSW1-PSW2. The static memory cell 200 in the embodiment described above is a single-ended static memory cell, while the static memory cell 300 in the present embodiment is a double-ended static memory cell. Namely, in the present embodiment, the switch SW4 is connected to the coupling point between the switch SW1 and the pull-down switch PSW1, and the on and off of the pull-down switch PSW1 is controlled by the voltage on the output terminal QB. The switch SW4 is also coupled to the bit line BLB. Besides, the switch SW4 is turned on or off according to the read word line signal RWL. The switch SW4 may be a transistor switch. Additionally, in the present embodiment, the switch SW1 is serially connected between the write word line signal WWLB and the output terminal QB and is turned on or off according to the write word line signal WWLB. The pull-down switch PSW1 is coupled between the terminal of the switch SW1 coupled to the switch SW4 and the reference ground voltage VVSS and is turned on or off according to the voltage on the output terminal QB.

The overall operation of the static memory cell 300 in the present embodiment is similar to that of the static memory cell 200 in the embodiment described above, and the only difference is that the static memory cell 300 in the present embodiment offers the bidirectional bit lines BL and BLB to read and write differential signals and increase the access speed of the static memory cell 300.

Figure 4:
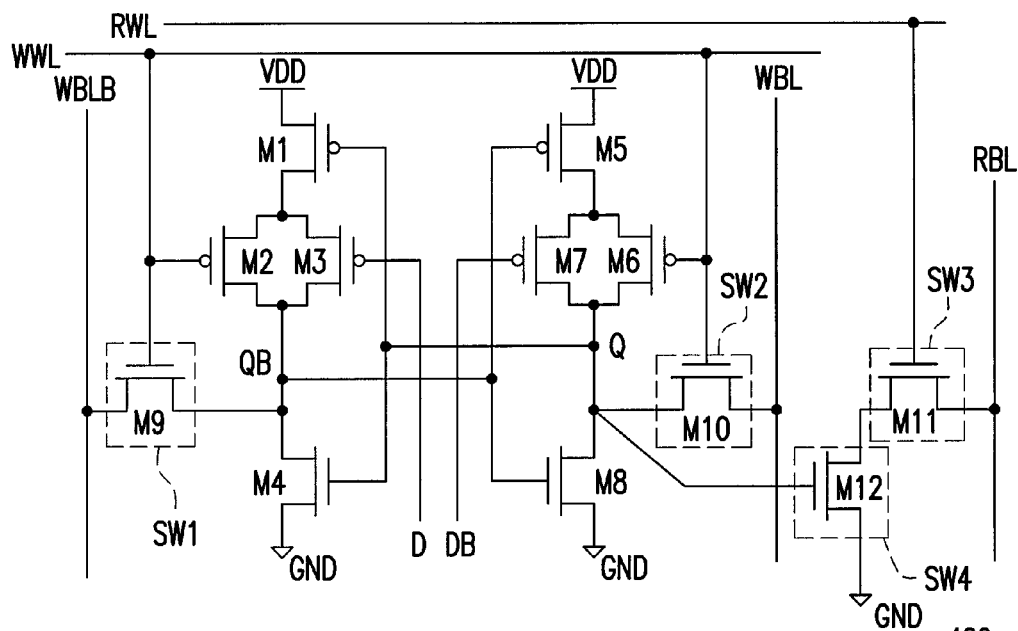
FIG. 4 is a diagram of a static memory cell 400 according to yet another embodiment of the present invention.

FIG. 4 is a diagram of a static memory cell 400 according to yet another embodiment of the present invention. Please refer to FIG. 4, the static memory cell 400 includes transistors M1-M8 and switches SW1-SW4. The first terminal of the transistor M1 is coupled to the reference operating power supply VDD. The first terminal of the transistor M2 is coupled to the second terminal of the transistor M1, the second terminal of the transistor M2 is coupled to the output terminal QB, and the control terminal of the transistor M2 receives a write word line signal WWL. The first terminal and the second terminal of the transistor M3 are respectively coupled to the first terminal and the second terminal of the transistor M2, and the control terminal of the transistor M3 receives a data signal D. The first terminal of the transistor M4 is coupled to the output terminal QB, the control terminal of the transistor M4 is coupled to the control terminal of the transistor M1 and the output terminal Q, and the second terminal of the transistor M4 is coupled to the ground terminal GND.

The first terminal of the transistor M5 is coupled to the reference operating power supply VDD. The first terminal of the transistor M6 is coupled to the second terminal of the transistor M5, the second terminal of the transistor M6 is coupled to the output terminal Q, and the control terminal of the transistor M6 receives the write word line signal WWL. The first terminal and the second terminal of the transistor M7 are respectively coupled to the first terminal and the second terminal of the transistor M6, the control terminal of the transistor M7 receives the reverse data signal DB. The first terminal of the transistor M8 is coupled to the output terminal Q, the control terminal of the transistor M8 is coupled to the control terminal of the transistor M5 and the output terminal QB, and the second terminal of the transistor M8 is coupled to the ground terminal GND.

The transistors M1-M3 and M5-M7 are P-type transistors, and the transistors M4 and M8 are N-type transistors. The control terminals of the transistors M1-M8 may be the gates thereof, the first terminals of the transistors M1-M3 and M5-M7 may be the sources thereof, and the second terminals of the transistors M1-M3 and M5-M7 may be the drains thereof. The first terminals of the transistors M4 and M8 may be the drains thereof, and the second terminals of the transistors M4 and M8 may be the sources thereof.

The first terminal of the switch SW1 is coupled to a reverse bit line WBLB, the second terminal of the switch SW1 is coupled to the output terminal QB, and the switch SW1 is turned on or off according to the write word line signal WWL. The first terminal of the switch SW2 is coupled to a bit line WBL, the second terminal of the switch SW2 is coupled to the output terminal Q, and the switch SW2 is turned on or off according to the write word line signal WWL. The first terminal of the switch SW4 is coupled to the ground terminal GND, and the switch SW4 is turned on or off according to the voltage on the output terminal Q. The first terminal of the switch SW3 is coupled to the second terminal of the switch SW4, the second terminal of the switch SW3 is coupled to a read bit line RBL, and the switch SW3 is turned on or off according to the read word line signal RWL.

In the present embodiment, the switches SW1-SW4 are respectively constructed by using the transistors M9-M12. Besides, the control terminal of the transistor M3 can be controlled by the data signal D, and the control terminal of the transistor M7 can be controlled by the reverse data signal DB.

Regarding the overall operation, when a data of logic 1 is to be written into the static memory cell 400, the write word line signal WWL, the data signal D, and the voltage on the bit line WBL are all logic 1, and the reverse bit line WBLB and the reverse data signal DB are both logic 0. The transistors M2 and M3 are turned off, and the transistor M7 is turned on. Through the turned-on switches SW1 and SW2, data on the bit line WBL and the reverse bit line WBLB is respectively transmitted to the output terminals Q and QB to complete the data writing operation. When a data of logic 0 is to be written, the write word line signal WWL, the data signal D, and the voltage on the bit line WBL are all logic 0, and the reverse bit line WBLB and the reverse data signal DB are both logic 1. The transistors M6 and M7 are turned off, and the transistor M3 is turned on. Besides, through the turned-on switches SW1 and SW2, data on the bit line WBL and the reverse bit line WBLB is respectively transmitted to the output terminals Q and QB to complete the data writing operation.

In the embodiment described above, the latching capability of the latch circuit constituted by the transistors M1-M8 is disabled by turning off the transistors M2 and M3 or the transistors M7 and M6, so that data can be easily and quickly written into the latch circuit, and accordingly the data writing performance of the static memory cell 400 can be improved.

Figure 5A:
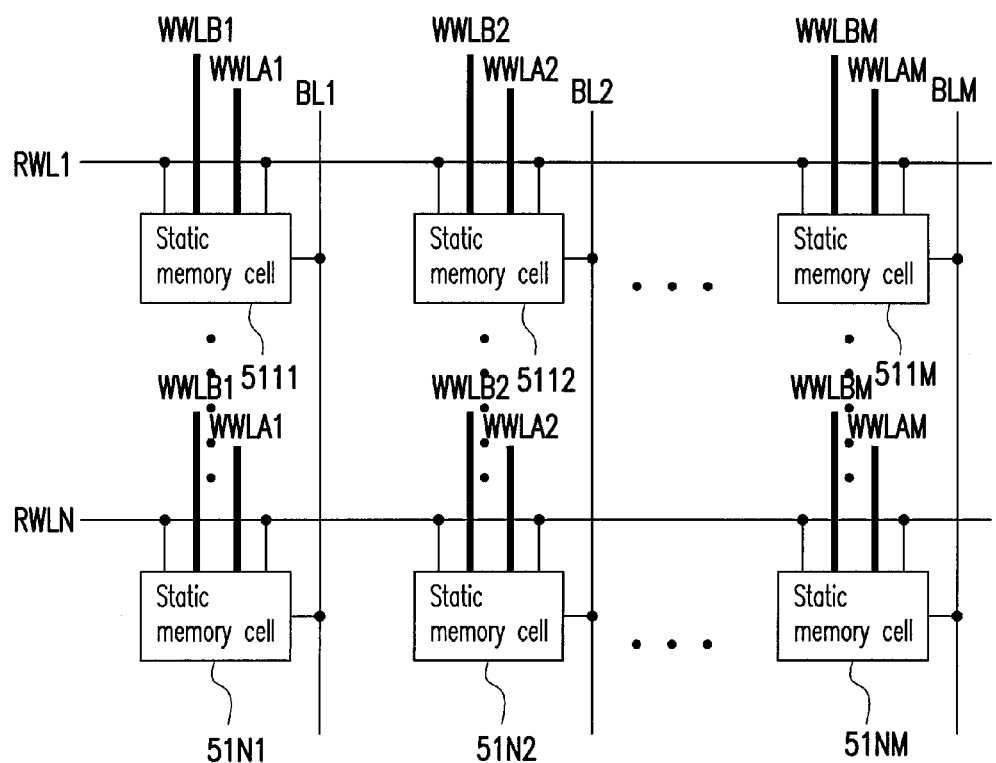
FIGS. 5A-5C respectively illustrate static memories 510-530 according to multiple embodiments of the present invention.

FIG. 5A illustrates a static memory 510 according to an embodiment of the present invention. Please refer to FIG. 5A, the static memory 510 includes a plurality of read word lines RWL1-RWLN, a plurality of bit lines BL1-BLM, and a plurality of static memory cells 5111-51NM. The read word lines RWL1-RWLN respectively transmit a plurality of read word line signals. Aforementioned bit line pairs respectively include a plurality of bit lines BL1-BLM. The static memory cells 5111-51NM are arranged into an array to form a plurality of memory cell columns and a plurality of memory cell rows. The static memory cells in the memory cell columns are respectively coupled to the bit line pairs, and the static memory cells in the memory cell rows are respectively coupled to the read word lines RWL1-RWLN. Taking the memory cell row having the static memory cells 511-51M as an example, the static memory cells 5111-511M are all coupled to the read word line RWL1. Taking the memory cell column having the static memory cells 5111-51N1 as an example, the static memory cells 511-5N1 are all coupled to the bit line BL1.

In addition, the static memory cells in the same memory cell column receive the same write word line signal. For example, both the static memory cells 5111 and 51N1 receive the write word line signals WWLB1 and WWLA1, both the static memory cells 5112 and 51N2 receive the write word line signals WWLB2 and WWLA2, and both the static memory cells 511M and 51NM receive the write word line signals WWLBM and WWLAM. Besides, the static memory cells in the same memory cell row are coupled to the same reference ground voltage, while the static memory cells in different memory cell rows are coupled to different reference ground voltages. For example, the static memory cells 5111 and 5112-511M are coupled to the reference ground voltage VVSS1, and the static memory cells 51N1 and 51M2-51NM are coupled to the reference ground voltage VVSSN.

It should be mentioned that the static memory cells 5111-51NM can be constructed by using the static memory cell 200 in the embodiment described above. Related operations have been described in detail in foregoing embodiments therefore will not be described herein.

Figure 5B:
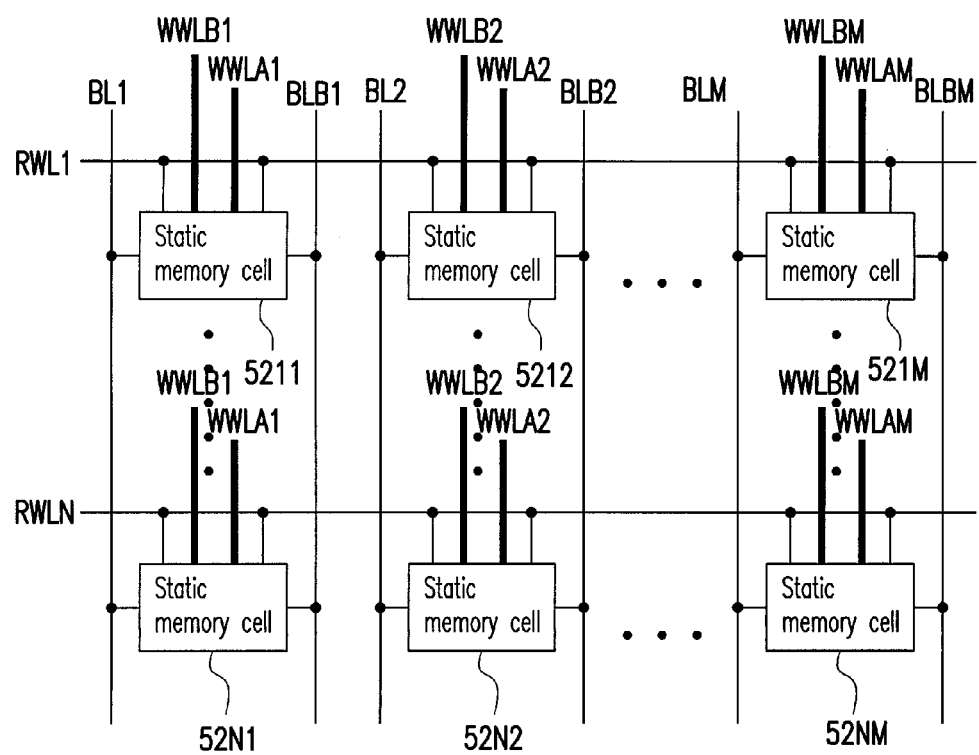

FIG. 5B illustrates a static memory 520 according to an embodiment of the present invention. Please refer to FIG. 5B, the static memory 520 includes a plurality of read word lines RWL1-RWLN, a plurality of bit line pairs formed by a plurality of bit lines BL1-BLM and a plurality of reverse bit lines BLB1-BLBM, and a plurality of static memory cells 5211-52NM. The read word lines RWL1-RWLN respectively transmit a plurality of read word line signals. The bit line pairs respectively include a plurality of bit line BL1-BLM and a plurality of reverse bit lines BLB1-BLBM. The static memory cells 5211-52NM are arranged into an array to form a plurality of memory cell columns and a plurality of memory cell rows. The static memory cells in the memory cell columns are respectively coupled to the bit line pairs, and the static memory cells in the memory cell rows are respectively coupled to the read word lines RWL1-RWLN. Taking the memory cell row having the static memory cells 5211-521M as an example, the static memory cells 5211-521M are all coupled to the read word line RWL1. Taking the memory cell column having the static memory cells 5211-52N1 as an example, the static memory cells 5211-52N1 are all coupled to the bit line pair constituted by the bit lines BL1 and BLB1.

Additionally, the static memory cells in the same memory cell column receive the same write word line signal. For example, both the static memory cells 5111 and 51N1 receive the write word line signals WWLB1 and WWLA1, both the static memory cells 5112 and 51N2 receive the write word line signals WWLB2 and WWLA2, and both the static memory cells 511M and 51NM receive the write word line signals WWLBM and WWLAM. Besides, the static memory cells in the same memory cell row are coupled to the same reference ground voltage, while the static memory cells in different memory cell rows are coupled to different reference ground voltages. For example, the static memory cells 5111 and 5112-511M are coupled to the reference ground voltage VVSS1, and the static memory cells 51N1 and 51M2-51NM are coupled to the reference ground voltage VVSSN.

It should be mentioned that the static memory cells 5211-52NM can be constructed by using the static memory cell 300 in the embodiment described above. Related operations have been described in detail in foregoing embodiments therefore will not be described herein.

Figure 5C:
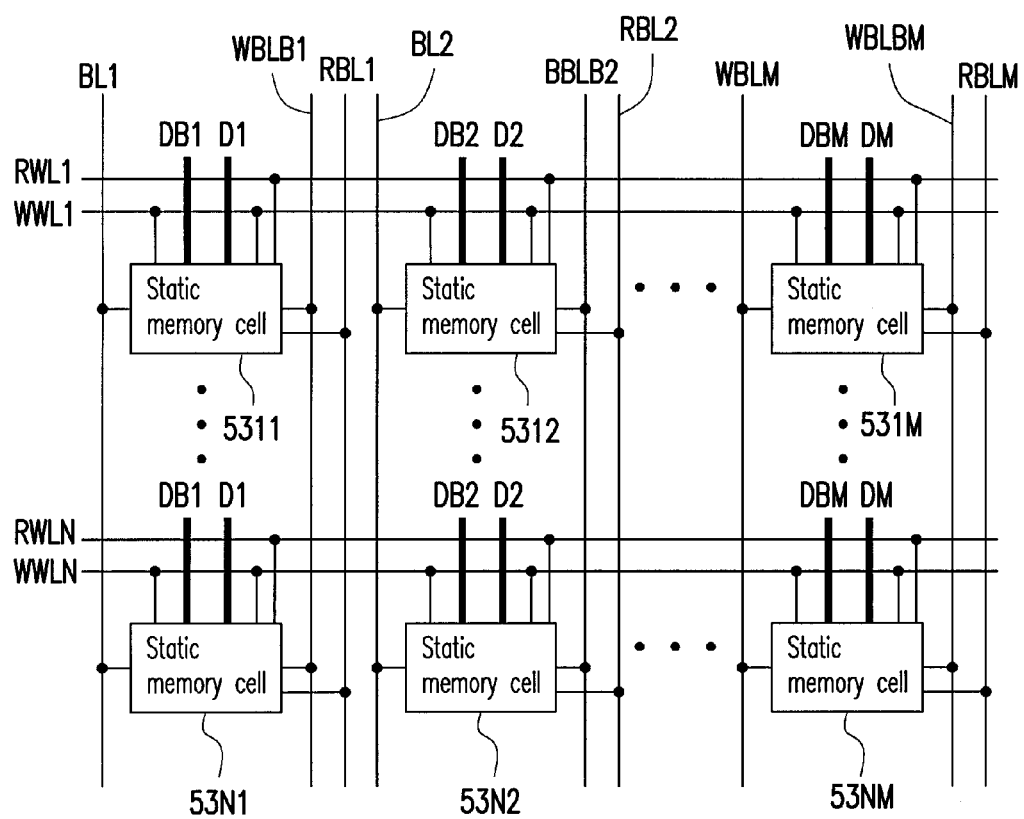

FIG. 5C illustrates a static memory 530 according to an embodiment of the present invention. Please refer to FIG. 5C, the static memory 530 includes a plurality of read word lines RWL1-RWLN, a plurality of bit line pairs formed by a plurality of bit lines WBL1-WBLM and WBLB1-WBLBM, a plurality of write word lines WWL1-WWLN, a plurality of read bit lines RBL1-RBLM, and a plurality of static memory cells 5311-53NM. The read word lines RWL1-RWLN respectively transmit a plurality of read word line signals. The static memory cells 5311-53NM are arranged into an array to form a plurality of memory cell columns and a plurality of memory cell rows. The static memory cells in the memory cell columns are respectively coupled to the bit lines WBL1-WBLM and WBLB1-WBLBM and the read bit lines RBL1-RBLM, and the static memory cells in the memory cell rows are respectively coupled to the read word lines RWL1-RWLN and the write word lines WWL1-WWLN. Taking the memory cell row having the static memory cells 5311-531M as an example, the static memory cells 5211-521M are all coupled to the read word line RWL1 and the write word line WWL1. Taking the memory cell column having the static memory cells 5311-53N1 as an example, the static memory cells 5311-53N1 are all coupled to the bit line pair constituted by the bit lines WBL1 and WBLB1 and the read bit line RBL1.

Additionally, the static memory cells in the same memory cell column receive the same data signal and reverse data signal. For example, both the static memory cells 5311 and 53N1 receive the data signal D1 and the reverse data signal DB1, both the static memory cells 5312 and 53N2 receive the data signal D2 and the reverse data signal DB2, and both the static memory cells 531M and 53NM receive the data signal DM and the reverse data signal DBM.

It should be mentioned that the static memory cells 5311-53NM can be constructed by using the static memory cell 400 in the embodiment described above. Related operations have been described in detail in foregoing embodiments therefore will not be described herein.

As described above, in a static memory cell provided by the present invention, the data writing performance and data writing speed are improved by disabling a latch circuit in the memory cell. Besides, in an embodiment of a static memory cell provided by the present invention, a data reading or writing operation can be performed without any operating power supply or accessing any peripheral circuit. Thereby, a static memory cell provided by the present invention can work with a low operating voltage, so that the power consumption of the entire system is reduced and the data writing performance of a static memory is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A static memory cell, comprising:
 a first transistor, having a first terminal, a second terminal, and a control terminal, wherein the first terminal of the first transistor is coupled to a reference operating power supply;
 a second transistor, having a first terminal, a second terminal, and a control terminal, wherein the first terminal of the second transistor is coupled to the second terminal of the first transistor, the second terminal of the second transistor is coupled to a first output terminal, and the control terminal of the second transistor receives a first write word line signal;
 a third transistor, having a first terminal, a second terminal, and a control terminal, wherein the first terminal of the third transistor is coupled to the first output terminal, the control terminal of the third transistor is coupled to the control terminal of the first transistor and a second output terminal, and the second terminal of the third transistor is coupled to a ground terminal;

a fourth transistor, having a first terminal, a second terminal, and a control terminal, wherein the first terminal of the fourth transistor is coupled to the reference operating power supply;

a fifth transistor, having a first terminal, a second terminal, and a control terminal, wherein the first terminal of the fifth transistor is coupled to the second terminal of the fourth transistor, the second terminal of the fifth transistor is coupled to the second output terminal, and the control terminal of the fifth transistor receives a second write word line signal;

a sixth transistor, having a first terminal, a second terminal, and a control terminal, wherein the first terminal of the sixth transistor is coupled to the second output terminal, the control terminal of the sixth transistor is coupled to the control terminal of the fourth transistor and the first output terminal, and the second terminal of the sixth transistor is coupled to the ground terminal;

a first switch, wherein a first terminal of the first switch is coupled to the first output terminal, and the first switch is turned on or off according to a read word line signal;

a second switch, wherein a first terminal of the second switch is coupled to the second output terminal, and the second switch is turned on or off according to the second write word line signal;

a third switch, wherein a first terminal of the third switch is coupled to a second terminal of the second switch, a second terminal of the third switch is coupled to a first bit line, and the third switch is turned on or off according to the read word line signal;

a first pull-down switch, serially connected between a second terminal of the first switch and a reference ground voltage, wherein the first pull-down switch is turned on or off according to a voltage of the first write word line signal; and a second pull-down switch, serially connected between the second terminal of the second switch and the reference ground voltage, wherein the second pull-down switch is turned on or off according to a voltage on the second output terminal.

2. The static memory cell according to claim 1, wherein when a writing operation is performed on the static memory cell, a voltage level of the first write word line signal and a voltage level of the second write word line signal are complementary.

3. The static memory cell according to claim 1, wherein a voltage on the first output terminal and the voltage on the second output terminal are complementary.

4. The static memory cell according to claim 1, wherein a voltage on the ground terminal and a voltage on the reference ground voltage are the same.

5. The static memory cell according to claim 1, wherein the first transistor, the second transistor, the fourth transistor, and the fifth transistor are P-type transistors, and the second transistor and the sixth transistor are N-type transistors.

6. The static memory cell according to claim 1, wherein the first switch, the second switch, and the third switch are transistor switches, and the first pull-down switch and the second pull-down switch are also transistor switches.

7. A static memory cell, comprising:

a first transistor, having a first terminal, a second terminal, and a control terminal, wherein the first terminal of the first transistor is coupled to a reference operating power supply;

a second transistor, having a first terminal, a second terminal, and a control terminal, wherein the first terminal of the second transistor is coupled to the second terminal of the first transistor, the second terminal of the second transistor is coupled to a first output terminal, and the control terminal of the second transistor receives a first write word line signal;

a third transistor, having a first terminal, a second terminal, and a control terminal, wherein the first terminal of the third transistor is coupled to the first output terminal, the control terminal of the third transistor is coupled to the control terminal of the first transistor and a second output terminal, and the second terminal of the third transistor is coupled to a ground terminal;

a fourth transistor, having a first terminal, a second terminal, and a control terminal, wherein the first terminal of the fourth transistor is coupled to the reference operating power supply;

a fifth transistor, having a first terminal, a second terminal, and a control terminal, wherein the first terminal of the fifth transistor is coupled to the second terminal of the fourth transistor, the second terminal of the fifth transistor is coupled to the second output terminal, and the control terminal of the fifth transistor receives a second write word line signal;

a sixth transistor, having a first terminal, a second terminal, and a control terminal, wherein the first terminal of the sixth transistor is coupled to the second output terminal, the control terminal of the sixth transistor is coupled to the control terminal of the fourth transistor and the first output terminal, and the second terminal of the sixth transistor is coupled to the ground terminal;

a first switch, wherein a first terminal of the first switch is coupled to the first output terminal, and the first switch is turned on or off according to the first write word line signal;

a second switch, wherein a first terminal of the second switch is coupled to the second output terminal, and the second switch is turned on or off according to the second write word line signal;

a third switch, wherein a first terminal of the third switch is coupled to a second terminal of the second switch, a second terminal of the third switch is coupled to a first bit line, and the third switch is turned on or off according to a read word line signal;

a first pull-down switch, serially connected between a second terminal of the first switch and a reference ground voltage, wherein the first pull-down switch is turned on or off according to a voltage on the first output terminal;

a second pull-down switch, serially connected between the second terminal of the second switch and the reference ground voltage, wherein the second pull-down switch is turned on or off according to a voltage on the second output terminal; and a fourth switch, wherein a first terminal of the fourth switch is coupled to the second terminal of the first switch, a second terminal of the fourth switch is coupled to a second bit line, and the fourth switch is turned on or off according to the read word line signal.

8. The static memory cell according to claim 7, wherein the fourth switch is a transistor switches.

9. A static memory cell, comprising:

a first transistor, having a first terminal, a second terminal, and a control terminal, wherein the first terminal of the first transistor is coupled to a reference operating power supply;

a second transistor, having a first terminal, a second terminal, and a control terminal, wherein the first terminal of the second transistor is coupled to the second terminal of the first transistor, the second terminal of the second transistor is coupled to a first output terminal, and the control terminal of the second transistor receives a write word line signal;

a third transistor, having a first terminal, a second terminal, and a control terminal, wherein the first terminal and the second terminal of the third transistor are respectively coupled to the first terminal and the second terminal of the second transistor, and the control terminal of the third transistor receives a data signal;

a fourth transistor, having a first terminal, a second terminal, and a control terminal, wherein the first terminal of the fourth transistor is coupled to the first output terminal, the control terminal of the fourth transistor is coupled to the control terminal of the first transistor and a second output terminal, and the second terminal of the fourth transistor is coupled to a ground terminal;

a fifth transistor, having a first terminal, a second terminal, and a control terminal, wherein the first terminal of the fifth transistor is coupled to the reference operating power supply;

a sixth transistor, having a first terminal, a second terminal, and a control terminal, wherein the first terminal of the sixth transistor is coupled to the second terminal of the fifth transistor, the second terminal of the sixth transistor is coupled to the second output terminal, and the control terminal of the sixth transistor receives the write word line signal;

a seventh transistor, having a first terminal, a second terminal, and a control terminal, wherein the first terminal and the second terminal of the seventh transistor are respectively coupled to the first terminal and the second terminal of the sixth transistor, and the control terminal of the seventh transistor receives a reverse data signal;

an eighth transistor, having a first terminal, a second terminal, and a control terminal, wherein the first terminal of the eighth transistor is coupled to the second output terminal, the control terminal of the eighth transistor is coupled to the control terminal of the fifth transistor and the first output terminal, and the second terminal of the eighth transistor is coupled to the ground terminal;

a first switch, wherein a first terminal of the first switch is coupled to a reverse bit line, a second terminal of the first switch is coupled to the first output terminal, and the first switch is turned on or off according to the write word line signal;

a second switch, wherein a first terminal of the second switch is coupled to a bit line, a second terminal of the second switch is coupled to the second output terminal, and the second switch is turned on or off according to the write word line signal;

a fourth switch, wherein a first terminal of the fourth switch is coupled to the ground terminal, and the fourth switch is turned on or off according to a voltage on the second output terminal; and a third switch, wherein a first terminal of the third switch is coupled to a second terminal of the fourth switch, a second terminal of the third switch is coupled to a read bit line, and the third switch is turned on or off according to a read word line signal.

10. The static memory cell according to claim 9, wherein the control terminal of the third transistor is coupled to the data signal.

11. The static memory cell according to claim 9, wherein the control terminal of the seventh transistor is coupled to the reverse data signal.

12. The static memory cell according to claim 9, wherein the first transistor, the second transistor, the third transistor, the fifth transistor, the sixth transistor, and the seventh transistor are P-type transistors, and the fourth transistor and the eighth transistor are N-type transistors.

13. The static memory cell according to claim 9, wherein the first switch, the second switch, the third switch, and the fourth switch are transistor switches.

14. A static memory, comprising:
a plurality of read word lines, respectively transmitting a plurality of read word line signals;
a plurality of bit lines; and
a plurality of static memory cells, wherein the static memory cells are arranged into an array to form a plurality of memory cell columns and a plurality of memory cell rows, the static memory cells in the memory cell columns are respectively coupled to the bit lines, the static memory cells in the memory cell rows are respectively coupled to the read word lines, and each of the static memory cells comprises:

a first transistor, having a first terminal, a second terminal, and a control terminal, wherein the first terminal of the first transistor is coupled to a reference operating power supply;

a second transistor, having a first terminal, a second terminal, and a control terminal, wherein the first terminal of the second transistor is coupled to the second terminal of the first transistor, the second terminal of the second transistor is coupled to a first output terminal, and the control terminal of the second transistor receives a first write word line signal;

a third transistor, having a first terminal, a second terminal, and a control terminal, wherein the first terminal of the third transistor is coupled to the first output terminal, the control terminal of the third transistor is coupled to the control terminal of the first transistor and a second output terminal, and the second terminal of the third transistor is coupled to a ground terminal;

a fourth transistor, having a first terminal, a second terminal, and a control terminal, wherein the first terminal of the fourth transistor is coupled to the reference operating power supply;

a fifth transistor, having a first terminal, a second terminal, and a control terminal, wherein the first terminal of the fifth transistor is coupled to the second terminal of the fourth transistor, the second terminal of the fifth transistor is coupled to the second output terminal, and the control terminal of the fifth transistor receives a second write word line signal;

a sixth transistor, having a first terminal, a second terminal, and a control terminal, wherein the first terminal of the sixth transistor is coupled to the second output terminal, the control terminal of the sixth transistor is coupled to the control terminal of the fourth transistor and the first output terminal, and the second terminal of the sixth transistor is coupled to the ground terminal;

a first switch, wherein a first terminal of the first switch is coupled to the first output terminal, and the first switch is turned on or off according to the corresponding read word line signal;

a second switch, wherein a first terminal of the second switch is coupled to the second output terminal, and the second switch is turned on or off according to the second write word line signal;

a third switch, wherein a first terminal of the third switch is coupled to a second terminal of the second switch, a second terminal of the third switch is coupled to the corresponding bit line, and the third switch is turned on or off according to the corresponding read word line signal;

a first pull-down switch, serially connected between a second terminal of the first switch and a reference ground voltage, wherein the first pull-down switch is turned on or off according to the first write word line signal; and a second pull-down switch, serially connected between the second terminal of the second switch and the reference ground voltage, wherein the second pull-down switch is turned on or off according to a voltage on the second output terminal.

15. A static memory, comprising:

a plurality of read word lines, respectively transmitting a plurality of read word line signals;

a plurality of bit line pairs, respectively comprising a plurality of bit lines and a plurality of reverse bit lines; and a plurality of static memory cells, wherein the static memory cells are arranged into an array to form a plurality of memory cell columns and a plurality of memory cell rows, the static memory cells in the memory cell columns are respectively coupled to the bit line pairs, the static memory cells in the memory cell rows are respectively coupled to the read word lines, and each of the static memory cells comprises:

a first transistor, having a first terminal, a second terminal, and a control terminal, wherein the first terminal of the first transistor is coupled to a reference operating power supply;

a second transistor, having a first terminal, a second terminal, and a control terminal, wherein the first terminal of the second transistor is coupled to the second terminal of the first transistor, the second terminal of the second transistor is coupled to a first output terminal, and the control terminal of the second transistor receives a first write word line signal;

a third transistor, having a first terminal, a second terminal, and a control terminal, wherein the first terminal of the third transistor is coupled to the first output terminal, the control terminal of the third transistor is coupled to the control terminal of the first transistor and a second output terminal, and the second terminal of the third transistor is coupled to a ground terminal;

a fourth transistor, having a first terminal, a second terminal, and a control terminal, wherein the first terminal of the fourth transistor is coupled to the reference operating power supply;

a fifth transistor, having a first terminal, a second terminal, and a control terminal, wherein the first terminal of the fifth transistor is coupled to the second terminal of the fourth transistor, the second terminal of the fifth transistor is coupled to the second output terminal, and the control terminal of the fifth transistor receives a second write word line signal;

a sixth transistor, having a first terminal, a second terminal, and a control terminal, wherein the first terminal of the sixth transistor is coupled to the second output terminal, the control terminal of the sixth transistor is coupled to the control terminal of the fourth transistor and the first output terminal, and the second terminal of the sixth transistor is coupled to the ground terminal;

a first switch, wherein a first terminal of the first switch is coupled to the first output terminal, and the first switch is turned on or off according to the first write word line signal;

a second switch, wherein a first terminal of the second switch is coupled to the second output terminal, and the second switch is turned on or off according to the second write word line signal;

a third switch, wherein a first terminal of the third switch is coupled to a second terminal of the second switch, a second terminal of the third switch is coupled to a first bit line among the bit lines, and the third switch is turned on or off according to a read word line signal;

a first pull-down switch, serially connected between a second terminal of the first switch and a reference ground voltage, wherein the first pull-down switch is turned on or off according to a voltage on the first output terminal;

a second pull-down switch, serially connected between the second terminal of the second switch and the reference ground voltage, wherein the second pull-down switch is turned on or off according to a voltage on the second output terminal; and a fourth switch, wherein a first terminal of the fourth switch is coupled to the second terminal of the first switch, a second terminal of the fourth switch is coupled to a second bit line among the reverse bit lines, and the fourth switch is turned on or off according to the read word line signal.

16. A static memory, comprising:

a plurality of read word lines, respectively transmitting a plurality of read word line signals;

a plurality of write word lines, respectively transmitting a plurality of write word line signals;

a plurality of bit line pairs, respectively comprising a plurality of bit lines and a plurality of reverse bit lines;

a plurality of read bit lines; and a plurality of static memory cells, wherein the static memory cells are arranged into an array to form a plurality of memory cell columns and a plurality of memory cell rows, the static memory cells in the memory cell columns are respectively coupled to the bit line pairs, the static memory cells in the memory cell rows are respectively coupled to the read word lines, and each of the static memory cells comprises:

a first transistor, having a first terminal, a second terminal, and a control terminal, wherein the first terminal of the first transistor is coupled to a reference operating power supply;

a second transistor, having a first terminal, a second terminal, and a control terminal, wherein the first terminal of the second transistor is coupled to the second terminal of the first transistor, the second terminal of the second transistor is coupled to a first output terminal, and the control terminal of the second transistor receives the corresponding write word line signal;

a third transistor, having a first terminal, a second terminal, and a control terminal, wherein the first terminal and the second terminal of the third transistor are respectively coupled to the first terminal and the second terminal of the second transistor, and the control terminal of the third transistor receives a data signal;

a fourth transistor, having a first terminal, a second terminal, and a control terminal, wherein the first terminal of the fourth transistor is coupled to the first output terminal, the control terminal of the fourth transistor is coupled to the control terminal of the first transistor and a second output terminal, and the second terminal of the fourth transistor is coupled to a ground terminal;

a fifth transistor, having a first terminal, a second terminal, and a control terminal, wherein the first terminal of the fifth transistor is coupled to the reference operating power supply;

a sixth transistor, having a first terminal, a second terminal, and a control terminal, wherein the first terminal of the sixth transistor is coupled to the second terminal of the fifth transistor, the second terminal of the sixth transistor is coupled to the second output terminal, and the control terminal of the sixth transistor receives the write word line signal;

a seventh transistor, having a first terminal, a second terminal, and a control terminal, wherein the first terminal and the second terminal of the seventh transistor are respectively coupled to the first terminal and the second terminal of the sixth transistor, and the control terminal of the seventh transistor receives a reverse data signal;

an eighth transistor, having a first terminal, a second terminal, and a control terminal, wherein the first terminal of the eighth transistor is coupled to the second output terminal, the control terminal of the eighth transistor is coupled to the control terminal of the fifth transistor and the first output terminal, and the second terminal of the eighth transistor is coupled to the ground terminal;

a first switch, wherein a first terminal of the first switch is coupled to the corresponding reverse bit line, a second terminal of the first switch is coupled to the first output terminal, and the first switch is turned on or off according to the corresponding write word line signal;

a second switch, wherein a first terminal of the second switch is coupled to the corresponding bit line, a second terminal of the second switch is coupled to the second output terminal, and the second switch is turned on or off according to the corresponding write word line signal;

a fourth switch, wherein a first terminal of the fourth switch is coupled to the ground terminal, and the fourth switch is turned on or off according to a voltage on the second output terminal; and a third switch, wherein a first terminal of the third switch is coupled to a second terminal of the fourth switch, a second terminal of the third switch is coupled to the corresponding read bit line, and the third switch is turned on or off according to the corresponding read word line signal.

* * * * *